United States Patent [19]
Fitch et al.

[11] Patent Number: 5,414,288
[45] Date of Patent: May 9, 1995

[54] VERTICAL TRANSISTOR HAVING AN UNDERLYING GATE ELECTRODE CONTACT

[75] Inventors: Jon T. Fitch; Carlos A. Mazuré; Keith E. Witek, all of Austin, Tex.

[73] Assignee: Motorola, Inc., Schaumburg, Ill.

[21] Appl. No.: 195,679

[22] Filed: Feb. 16, 1994

Related U.S. Application Data

[62] Division of Ser. No. 979,073, Nov. 19, 1992, Pat. No. 5,324,673.

[51] Int. Cl.$^6$ ............... H01L 29/10; H01L 29/78
[52] U.S. Cl. ................. 257/328; 257/329; 257/347; 257/74; 257/401; 257/369; 257/377
[58] Field of Search ............. 257/60, 135, 263, 302, 257/328, 329, 330, 401, 623, 278, 334, 369, 903, 347, 74, 377

[56] References Cited

U.S. PATENT DOCUMENTS

| | | | |
|---|---|---|---|
| 4,449,285 | 5/1984 | Janes et al. | 29/571 |
| 4,530,149 | 7/1985 | Jastrzebski et al. | 29/571 |
| 4,663,831 | 5/1987 | Birrittella et al. | 29/576 |
| 4,740,826 | 4/1988 | Chatterjee | 257/369 |
| 4,902,641 | 2/1990 | Koury, Jr. | 437/62 |
| 4,937,641 | 6/1990 | Sunami et al. | 257/302 |
| 4,975,754 | 12/1990 | Ishiuchi et al. | 257/329 |
| 5,010,386 | 4/1991 | Groover, III | 257/369 |
| 5,057,896 | 10/1991 | Gotou | 257/288 |
| 5,087,581 | 2/1992 | Rodder | 437/41 |
| 5,122,848 | 6/1992 | Lee et al. | 257/265 |
| 5,136,350 | 8/1992 | Itoh | 257/401 |
| 5,208,172 | 5/1993 | Fitch et al. | 437/40 |
| 5,235,189 | 8/1993 | Hayden et al. | 257/329 |
| 5,252,849 | 10/1993 | Fitch et al. | 257/329 |
| 5,276,343 | 1/1994 | Kumagai et al. | 257/302 |

FOREIGN PATENT DOCUMENTS

| | | |
|---|---|---|
| 60-189962 | 9/1985 | Japan. |
| 1-268172 | 10/1989 | Japan. |
| 2-79475 | 3/1990 | Japan. |
| 3-42873 | 2/1991 | Japan. |

OTHER PUBLICATIONS

"High Performance Characteristics in Trench Duel--Gate MOSFET (TDMOS)", Tomohisa et al., IEEE Trans. on Elect. Dev., Sep. 1991, pp. 2121-2127.

"Impact of Surrounding Gate Transistor (SGT) for Ultra-High-Density LSI's," by H. Takato et al. IEEE Transactions on Electronic Devices, vol. 39, No. 3, Mar. 1991, pp. 573-577.

"VMOS: High-Speed TTL Compatible MOS Logic," by T. Rodgers et al., IEEE Journal of Solid State Circuits, Oct. 1974, pp. 239-249.

Primary Examiner—Mark V. Prenty
Assistant Examiner—John Gray
Attorney, Agent, or Firm—Keith E. Witek

[57] ABSTRACT

A method for forming a vertical transistor (10) begins by providing a substrate (12). A conductive layer (16) is formed overlying the substrate (12). A first current electrode (26), a second current electrode (30), and a channel region (28) are each formed via one of either selective growth, epitaxial growth, in-situ doping, and-/or ion implantation. A gate electrode or control electrode (34) is formed laterally adjacent the channel region (28). A selective/epitaxial growth step is used to connect the conductive layer (16) to the control electrode (34) and forms a control electrode interconnect which is reliable and free from electrical short circuits to the current electrodes (26 and 30). The transistor (10) may be vertically stacked to form compact inverter circuits.

7 Claims, 6 Drawing Sheets

VERTICAL TRANSISTOR HAVING AN UNDERLYING GATE ELECTRODE CONTACT

This is a divisional of application Ser. No. 07/979,073, filed Nov. 19, 1992, now U.S. Pat. No. 5,234,673.

FIELD OF THE INVENTION

The present invention relates generally to semiconductor technology, and more particularly, to methods for forming vertical transistors.

BACKGROUND OF THE INVENTION

Planar transistors are often used to fabricate integrated circuits. A planar transistor has a diffused source electrode and a diffused drain electrode separated by a channel region. Overlying the channel region is a gate electrode that is separated from the channel region by a gate oxide. Planar transistors, although used and useful in many integrated circuit applications, are substrate area intensive. In other words, planar transistors consume a large amount of substrate surface area per transistor. In addition, with integrated circuit geometries decreasing into sub-micron ranges, planar transistors have various disadvantages. At smaller geometries and thinner gate oxide thicknesses, well documented problems such as hot carrier injection, leakage currents, isolation, short channel behavior, and channel length variations are major problems in planar transistors.

To overcome some of the disadvantages described above for planar transistors, elevated source and drain transistors, lightly doped drain (LDD) transistors, and other improvements were developed. Although the improvements reduced some of the disadvantages listed above, the improvements had some undesirable characteristics. The primary undesirable characteristic is the fact that the improved transistors were, in most cases, as area intensive or more area intensive than the planar transistor.

Various approaches have been used to try to reduce transistor surface area and increase transistor packing density while at the same time reducing some of the adverse effects described above. The surrounding gate transistor (SGT) was developed wherein a spacer gate and planar diffusions are used to form a transistor having a vertical current flow (i.e. a vertically directed channel region). The SGT reduced some of the disadvantages that affect planar transistors and reduced surface area due to a vertically positioned spacer gate.

Topography problems and the geometry of the SGT usually result in source contacts, drain contacts, and gate contacts which are difficult to achieve and are difficult to consistently produce using sub-micron technology. The contact to the spacer gate is very difficult to manufacture due to the fact that the spacer gate is contacted from the top. Spacers have a small top-down surface area and are difficult to contact from the top. In addition, the source and drain must not be electrically short circuited when contacting the spacer gate. Therefore, the gate contact for the SGT is extremely alignment and etch critical. In addition, doping of source regions, drain regions, and channel regions via implants can be difficult due to transistor geometry and may require special processing.

Other vertical transistors are known in the art. These transistors typically require trench processing or polysilicon-grown gate dielectrics. Both trench processing and polysilicon-grown gate dielectrics are undesirable in most cases, primarily due to reliability constraints.

In order to further increase circuit density and manufacturing reliability, vertical transistors structures and processes must improve.

SUMMARY OF THE INVENTION

The previously mentioned disadvantages are overcome and other advantages achieved with the present invention. In one form, the present invention comprises a method for forming a transistor wherein a substrate is provided. A conductive layer is formed overlying the substrate. A transistor region at least partially overlying the substrate and laterally adjacent the conductive layer is formed. The transistor region has a first current electrode overlying a second current electrode wherein the first current electrode and the second current electrode are separated by a channel region. A sidewall conductive control electrode is formed adjacent the channel region. The sidewall conductive control electrode and the conductive layer are selectively grown together to form an electrical interconnect for the sidewall conductive control electrode. Both a vertical transistor structure and a method for forming a vertical transistor structure are taught herein.

The present invention will be more clearly understood from the detailed description below in conjunction with the accompanying drawings.

Description of a Preferred Embodiment

Figure 1:
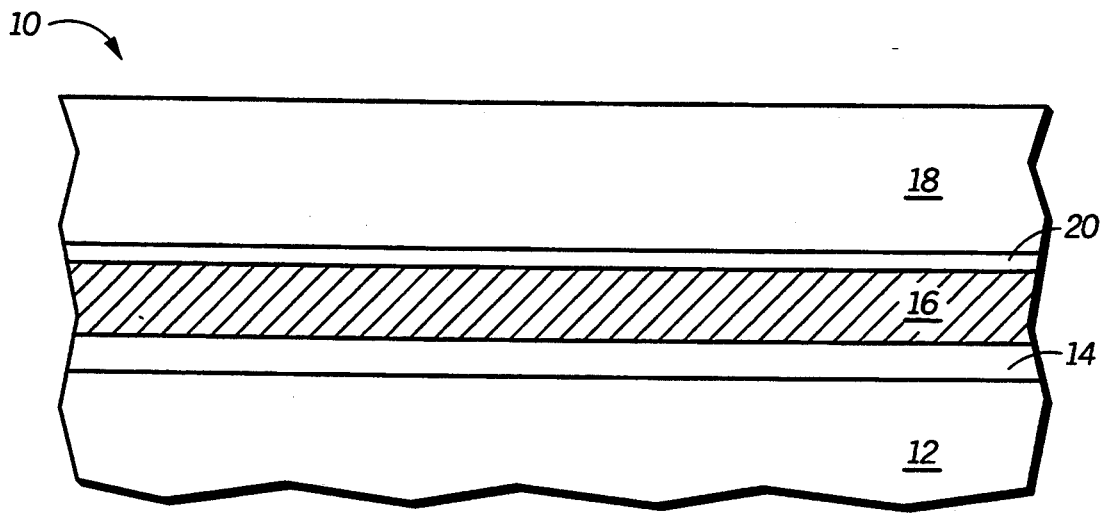
FIGS. 1–6 illustrate, in cross-sectional form, a method for forming a vertical transistor in accordance with the present invention.

Illustrated in FIG. 1 is a structure suitable for formation of a vertical transistor 10. The vertical transistor 10 has a substrate 12 having a surface and having a first conductivity type. Substrate 12 may be made of silicon, gallium arsenide, silicon on sapphire (SOS), epitaxial formations, germanium, germanium silicon, diamond, silicon on insulator (SOI) material, and/or like substrate materials. Preferably, the substrate 12 is made of silicon. In some cases, the substrate 12 may be a current electrode (i.e. source or drain) of an underlying vertical transistor. Diffusion regions (not illustrated in FIG. 1) may be optionally and conventionally formed within the substrate 12. A first dielectric layer 14 is formed overlying the substrate 12. A conductive layer 16 is formed overlying the dielectric layer 14. In a preferred form, conductive layer 16 is polysilicon, but conductive layer 16 may be a metal, a salicide or silicide, germanium silicon, a conductive oxide, or the like. A second dielectric layer 18 is formed overlying the conductive layer 16.

The dielectric layers 14 and 18, and all other dielectrics described herein may vary in physical and chemical composition based upon the function they perform. The dielectric layers described herein may be wet or dry silicon dioxide ($SiO_2$), a nitride material, tetra-ethylortho-silicate (TEOS) based oxides, boro-phosphate-silicate-glass (BPSG), phosphate-silicate-glass (PSG), boro-silicate-glass (BSG), oxide-nitride-oxide (ONO), tantalum pentoxide ($Ta_2O_5$), plasma enhanced silicon nitride ($P-SiN_x$), titanium oxide, and/or like dielectric materials. Specific dielectrics are noted herein when a specific dielectric material is preferred or required.

In FIG. 1, an etch stop layer 20 is illustrated. The etch stop layer 20, which is preferably nitride, is optional and is therefore not discussed in detail in subsequent figures. The etch stop layer 20 is used to protect the conductive layer 16 when the dielectric layer 18 is removed in FIG. 4.

Figure 2:
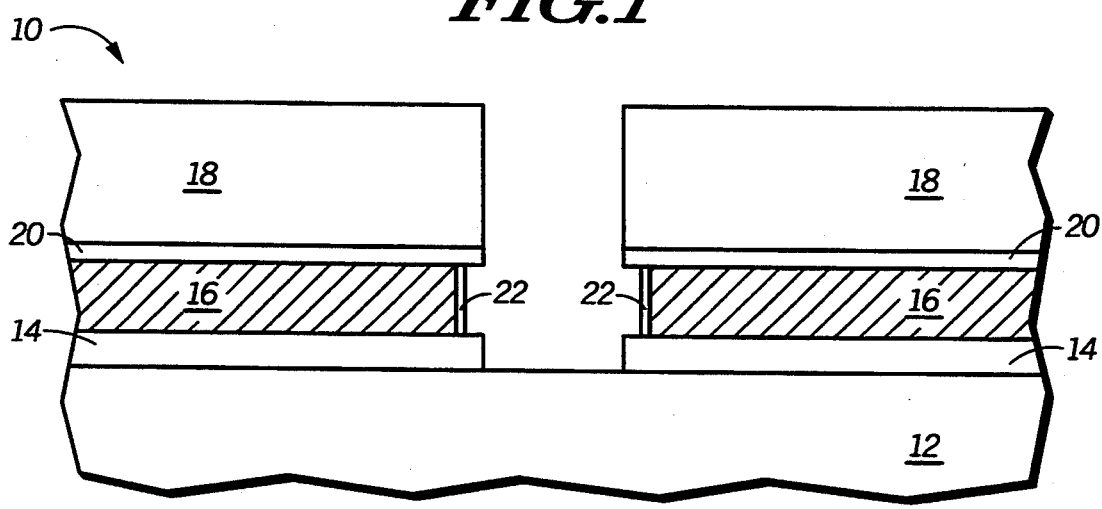

In FIG. 2, a masking layer of photoresist (not illustrated) is formed overlying the dielectric layer 18. The masking layer of photoresist (not illustrated) is conventionally patterned and etched to form a mask opening (not illustrated) that exposes a portion of the dielectric layer 18. A portion of the dielectric layer 18 is etched selective to the conductive layer 16 to form an opening in the dielectric layer 18. A portion of the conductive layer 16 is etched selective to the dielectric layer 14 to deepen the opening by etching into conductive layer 16. A portion of the dielectric layer 14 is etched selective to the substrate 12 to further deepen the opening by etching into dielectric layer 14. The etching of dielectric layer 14 exposes a portion of the surface of the substrate 12. The etching of the dielectric layers 14 and 18 and conductive layer 16 results in an opening that is self-aligned to the photoresist mask opening (not illustrated). The opening is sometimes referred to as a device opening due to the fact that the opening is used to form one or more vertical transistor devices. It should be noted that non-selective etches, cluster/batch etch processing, and multiple etch processing steps are possible for the formation of the device opening.

Figure 3:
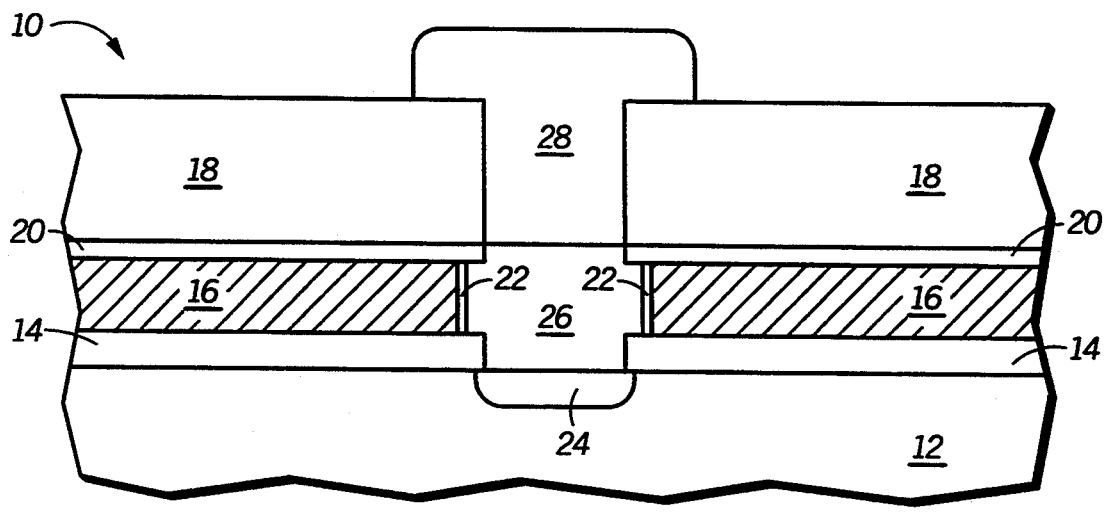

In FIG. 3, a diffusion region 24, referred to in some cases as a diffusion, is formed within the substrate 12 in one of at least two ways. In one form, the diffusion region 24 may be implanted or diffused into the substrate selectively through the use of one of a photoresist mask, an oxide mask, a nitride mask or the like. Diffusion region 24, in a similar manner, can be implanted through an oxide or like material to ensure a shallow, dopant-dispersed junction. This implantation or diffusion occurs before the formation of the conductive layer 16. In a second method, the diffusion region 24 may be implanted or diffused after the formation of the device opening. The second method, when using ion implantation, results in a diffusion region 24 which is self-aligned to the device opening. The opening can be of any geometry or size but is preferably a contact of minimum lithographic feature size.

FIG. 3 illustrates the formation of a sidewall dielectric layer 22. A sidewall dielectric layer 22 is formed on a sidewall of the conductive layer 16 which resulted from the formation of the opening in FIG. 2. The sidewall dielectric layer 22 is in most cases a grown $SiO_2$ layer and/or an overetched spacer formation. The growth of sidewall dielectric layer 22 will result in a thin dielectric layer (not illustrated) being grown on any exposed surface of the substrate 12.

The formation of a dielectric layer (not illustrated) on the substrate 12 is a side-effect that is undesirable. Therefore, a reactive ion etch (RIE) is used to remove all unwanted substrate-formed oxides while leaving the sidewall dielectric layer 22 relatively unchanged/unetched. A removable spacer (not illustrated) or a like formation may be used to further protect the sidewall dielectric layer 22. The RIE oxide/dielectric etch removes all oxides over vertically exposed portions of the substrate 12. RIE etching is inherently a downward directional or vertically directed etch. A spacer (not illustrated) or portions of a spacer (not illustrated) may be optionally used to further thicken the sidewall dielectric layer 22.

In order to more completely avoid RIE damage to the sidewall dielectric layer 22, FIG. 3 illustrates that an isotropic etch may be used to laterally recess the sidewall of the conductive layer 16. The lateral-recessing isotropic etch will use the dielectric layer 14 as a protective mask for the substrate 12. This isotropic etch will laterally recess the sidewall of the conductive layer 16 so that the sidewall dielectric layer 22, when formed, is laterally recessed away from the center of the opening.

In FIG. 3, a first current electrode 26, referred to as one of either a drain or a source, and a channel region 28 are formed. In a preferred form, a grown conductive transistor region (i.e. epitaxial or selectively grown region) is used to form the first current electrode 26 and the channel region 28. Preferably, the grown conductive transistor region is formed via epitaxial growth which duplicates a crystal orientation of the substrate 12.

To form the current electrode 26 and the channel region 28, the vertical transistor 10 is placed into a piece of equipment suitable for epitaxial/selective growth. Growth is initiated by heating vertical transistor 10 and subjecting exposed portions of the diffusion 24 or substrate 12 to a chemical compound such as dichlorosilane or a similar silicon source gas.

Initially, the first current electrode 26 is formed in the device opening. Electrode 26 is formed of a second conductivity type which is opposite the first conductivity type (i.e. the conductivity type of the substrate 12). In order to dope the electrode 26 with dopant atoms of the second conductivity type, in-situ doping is preferred although ion implantation and/or thermal diffusion of dopants is possible. In-situ doping means that the electrode 26 is doped during growth by a dopant gas source. If the second conductivity type is P type, then a boron-containing gas or a like dopant gas is used to dope electrode 26. If the second conductivity type is N type, then a phosphorus-containing and/or arsenic-containing or like dopant gas is used to dope electrode 26. Electrode 26 is grown, with in-situ doping, until the electrode is adjacent or nearly adjacent a top portion of the sidewall dielectric 22 or is adjacent the mask layer 20. The height of the electrode 26 adjacent the sidewall dielectric layer 22 determines transistor capacitive coupling, such as Miller capacitance and/or like capacitance values. Electrode 26 is adjacent the first dielectric layer 14 as illustrated in FIG. 3.

Epitaxial growth continues in a similar manner to form the channel region 28. The channel region 28 is formed of the first conductivity type, preferably via in-situ doping as described above. The doping of the channel region 28 may be altered to adjust the threshold voltage of vertical transistor 10. The channel region 28 is grown until the channel region 28 is either substantially planar with dielectric layer 18 or until a portion of the channel region laterally overgrows the dielectric layer 18 as illustrated in FIG. 3.

Figure 4:
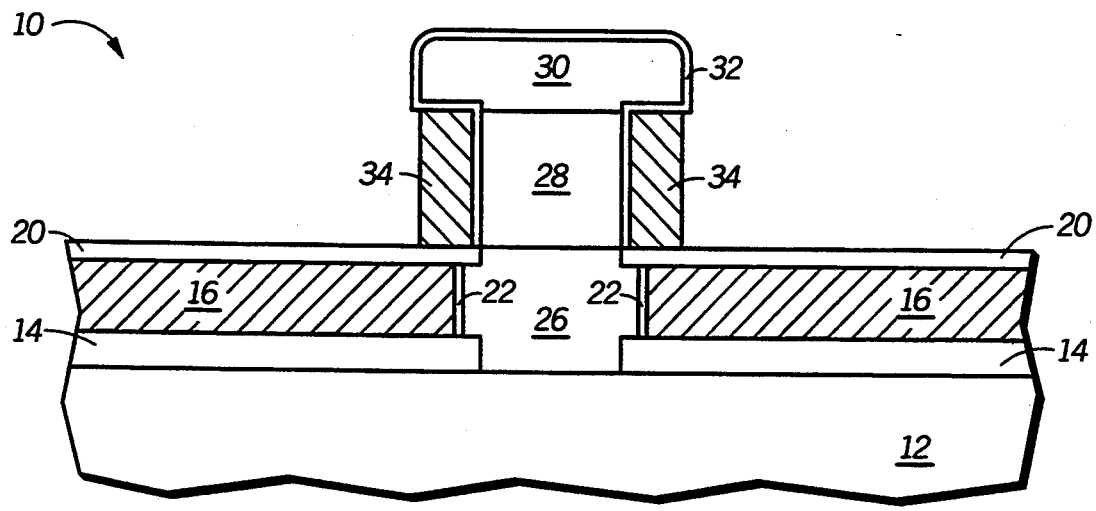

In one form, as illustrated in FIG. 4, an ion implant step is used to form the second current electrode 30 after formation of the channel region 28. In another form, the second current electrode 30 may be epitaxially grown and in-situ doped from the channel region 28 as taught herein.

In FIG. 4, the dielectric layer 18 is removed via an etch step. The optional etch stop layer 20 is used to protect the conductive layer 16. A dielectric layer 32 is formed upon the surface of the second current electrode 30 and the channel region 28. Preferably, the dielectric layer 32 is a grown silicon dioxide ($SiO_2$) layer that functions as a gate oxide. Due to the fact that the dielectric layer 32 functions as a gate oxide, the dielectric layer 32 is usually formed having a thickness within the range of roughly 4 nm to 30 nm. A composite oxide (i.e. $SiO_2$ and a TEOS based oxide) may be used to improve the gate oxide quality.

Optionally, a thick dielectric material (not illustrated) may be grown on the surface of the second current electrode in FIG. 3 to thicken the oxide over the electrode 30 without affecting the thickness of the dielectric layer 32 (i.e. gate oxide). This initial oxide growth may improve capacitive coupling and help reduce electrical short circuits within the transistor 10.

A conformal layer of conductive material (not specifically illustrated in FIG. 4) is formed overlying the dielectric layer 32. The conformal layer of conductive material (not specifically illustrated) is etched in a manner similar to spacer etch technology to form a gate electrode or a control electrode 34. If the second current electrode 30 is laterally overgrown as illustrated in FIG. 4, the control electrode 34 is self-aligned around the channel region 28 as illustrated.

Figure 5:
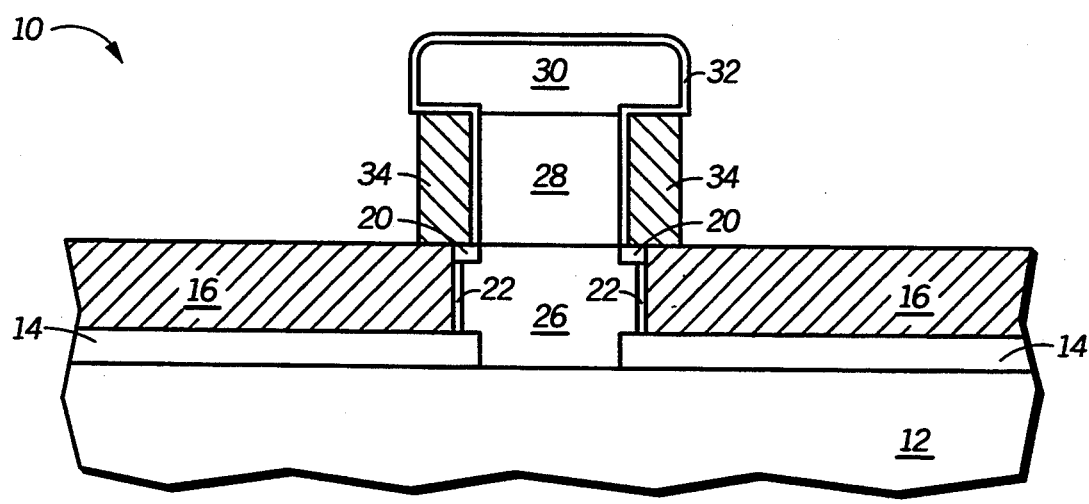

In FIG. 5, after formation of the control electrode 34, the etch stop layer 20 is removed or partially removed via an wet and/or dry etch process. A brief epitaxial or selective growth step is used to connect the control electrode 34 to the conductive layer 16. This epitaxial connection forms a control electrode interconnection for the transistor 10 which is not defined by lithography.

It is usually advantageous to have a transistor with a half lightly doped drain (LDD) structure (i.e. one current electrode has an LDD formation while the other current electrode does not) LDD regions result in an increase in series resistance. If an LDD region can be formed only at a source electrode, where an LDD region is most needed, the known advantages of the LDD structure are preserved while reducing series resistance. It should be noted that the source electrode and the drain electrode are interchangeable in the structure of FIG. 4. Regardless of whether the first current electrode 26 or second current electrode 30 is the drain/source, an LDD electrode can always be formed for only one of the current electrodes. It is important to note that LDD regions in transistor 10 are optional, and the doping for both the source and the drain regions may be constant with no LDD regions.

Furthermore, full LDD regions may be formed for transistor 10. In other words, both the first current electrode 26 and the second current electrode 30 may have LDD formations. In addition, dynamic altering or computer control of in-situ doping will allow graded source and drain junctions to be formed as LDD regions.

It is also important to note that epitaxial growth requires a clean surface, therefore before initiating growth a cleaning cycle, such as a conventional RCA oxidizing clean, an Ishizaka-Shiraki clean, or an equivalent cleaning cycle, is performed. In addition, a thin film transistor (TFT) can be formed by the epitaxial process taught above. If the substrate 12 is polysilicon instead of single crystalline silicon, then polysilicon electrode regions and channel regions may be epitaxially grown. This polysilicon growth forms a vertical TFT that will be similar in structure to the transistor 10 of FIG. 4. A vertical TFT can be helpful in terms of saving area in memory cell designs.

The transistor 10 has several advantages over other vertical transistor structures. The transistor 10 has a gate dielectric which is preferably silicon dioxide grown from a single crystalline silicon material. The fact that the gate oxide is a thin layer of silicon dioxide grown from a pure silicon material results in a higher quality oxide than a polysilicon-formed oxide or a nitride. Therefore, the transistor 10 is more compatible with conventional planar transistor technology, and is more reliable than other vertical metal oxide semiconductor (MOS) transistors.

Most transistors which have a spacer-like structure as a gate (for example, the SGT) are electrically contacted from the top by a conductive layer. This contact may result in the gate easily being electrically short circuited to the second current electrode. Also, the contact may not electrically connect to the gate due to the fact that a spacer has a small top-down surface area which may be used for contacting in a top-down manner. This small top-down surface contact area is difficult to lithographically align and reliably contact. Transistor 10 has a gate electrode contact which is not lithographically limited and not subject to electrical short circuits.

The lateral overgrowth of the second current electrode 30 results in the second current electrode 30 having a larger contact area. In addition, the chances of electrically short circuiting the control electrode 34 with the second current electrode 30 are reduced or eliminated due to the lateral overgrowth of electrode 30. The surrounding gate transistor (SGT) and other vertical transistors do not have a lateral overgrowth feature.

Figure 6:
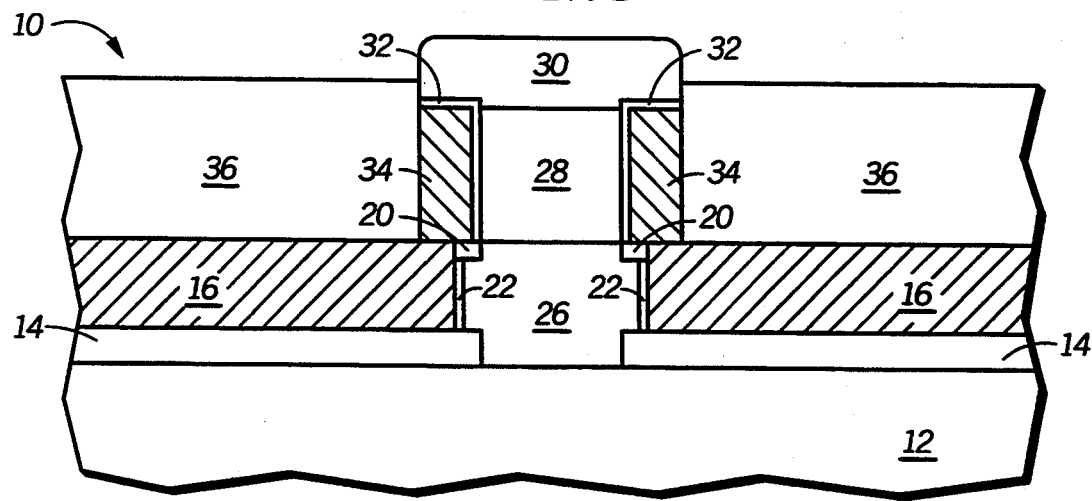

In FIG. 6, a reflowed glass, a spin-on glass, a planarized layer, a planar material, or a dielectric region referred to as dielectric layer 36 is formed overlying the conductive layer 16. Planarization, reflow, or lithography and etching are used to expose the second current electrode 30. A polysilicon, metal, or a like conductive layer (not illustrated) may be used to electrically contact the electrode 30.

FIGS. 7-11 illustrate that a second transistor 11 may be formed over the transistor 10 of FIG. 6. Due to the fact that the process for transistor 11 is similar to the process of FIGS. 1-6, a detailed process flow for transistor 11 is not provided.

Figure 7:
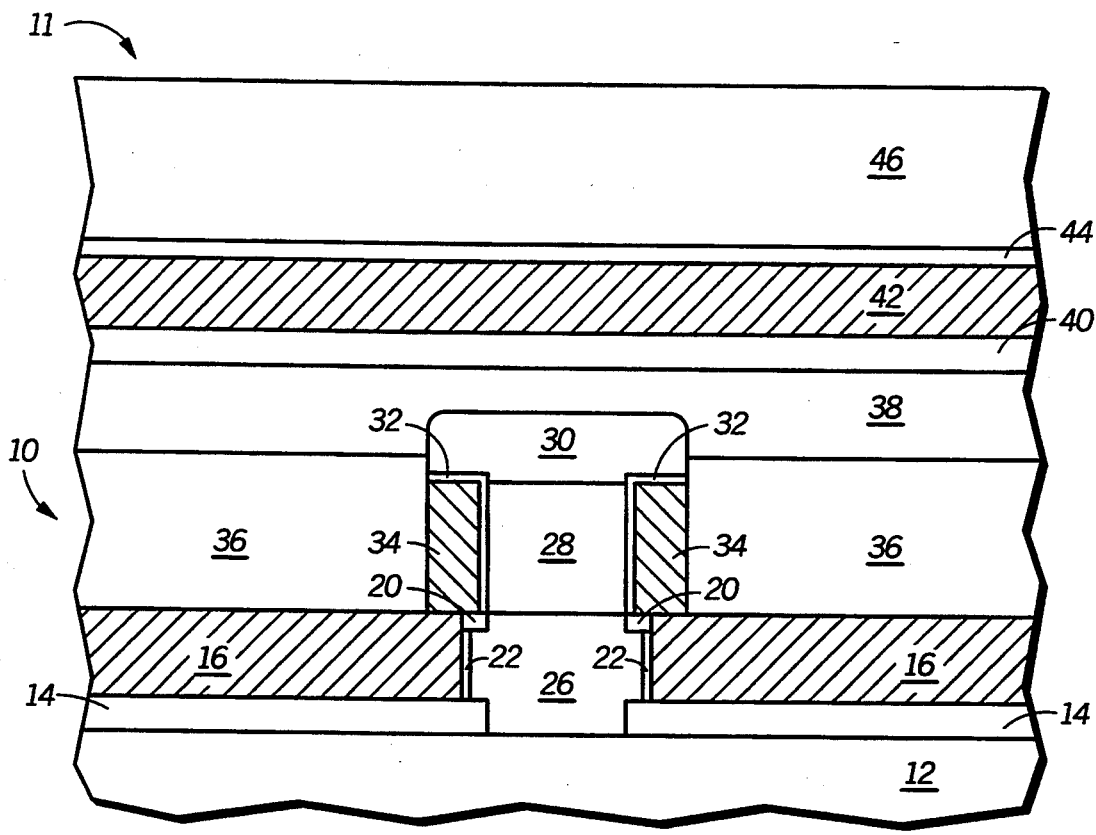
FIGS. 7–11 illustrate, in cross-sectional form, a method for forming a vertical transistor over the vertical transistor of FIG. 6 in accordance with the present invention.

In FIG. 7, dielectric layers 38, 40, and 46 are formed. Dielectric layers 38 and 40 may be a single layer. A conductive layer 42 is formed and an etch stop layer 44 is optionally formed.

Figure 8:
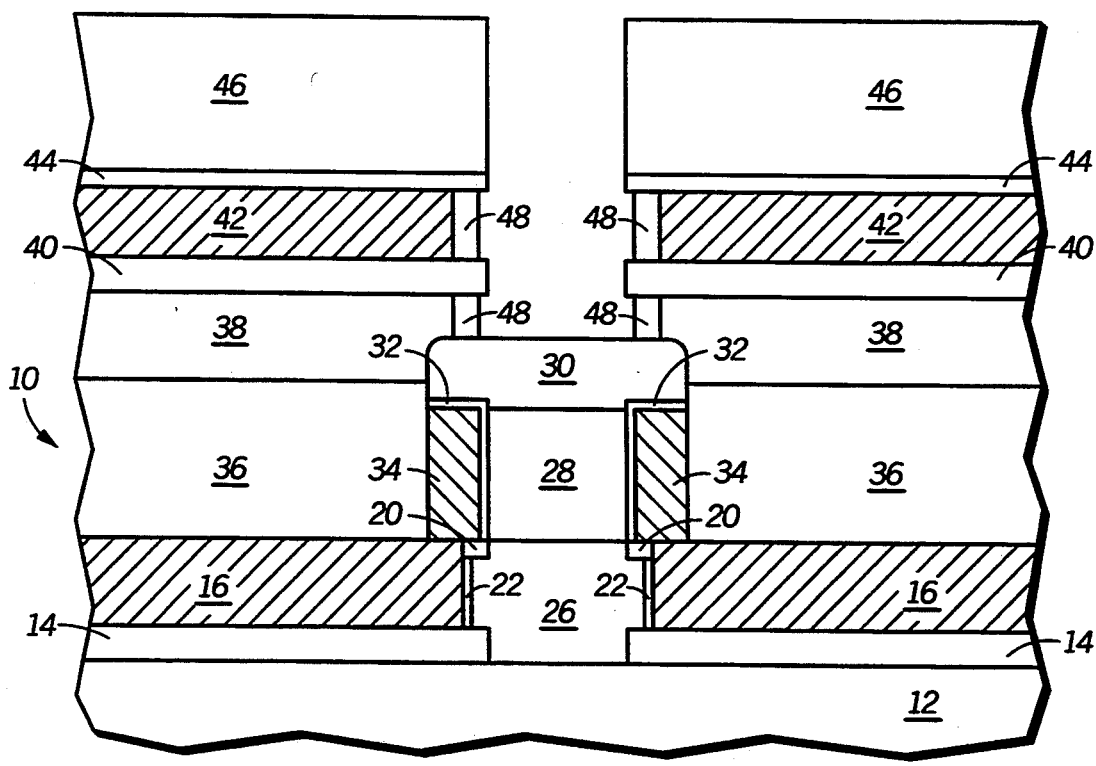

In FIG. 8, an opening is formed in a manner similar to FIG. 2, and a sidewall dielectric layer 48 is formed. The opening exposes a portion of the second current electrode 30.

Figure 9:
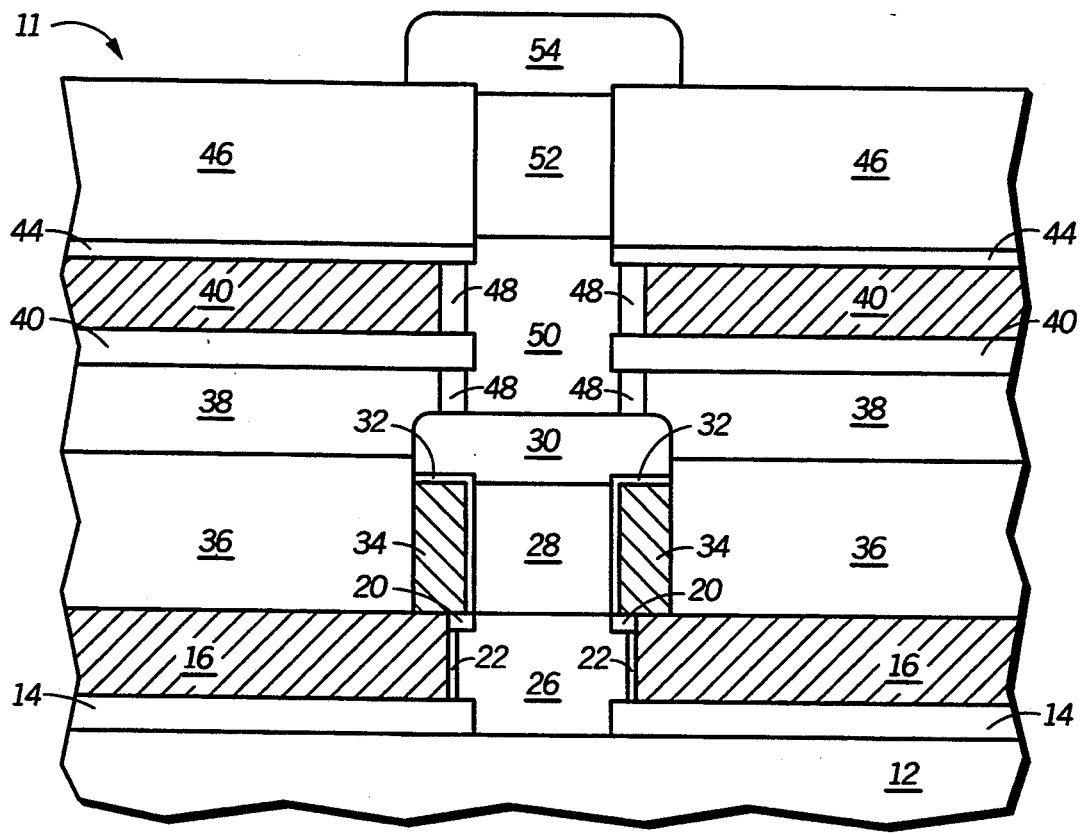

In FIG. 9, a first current electrode 50, a channel region 52, and a second current electrode 54 are formed as taught in FIG. 3.

Figure 10:
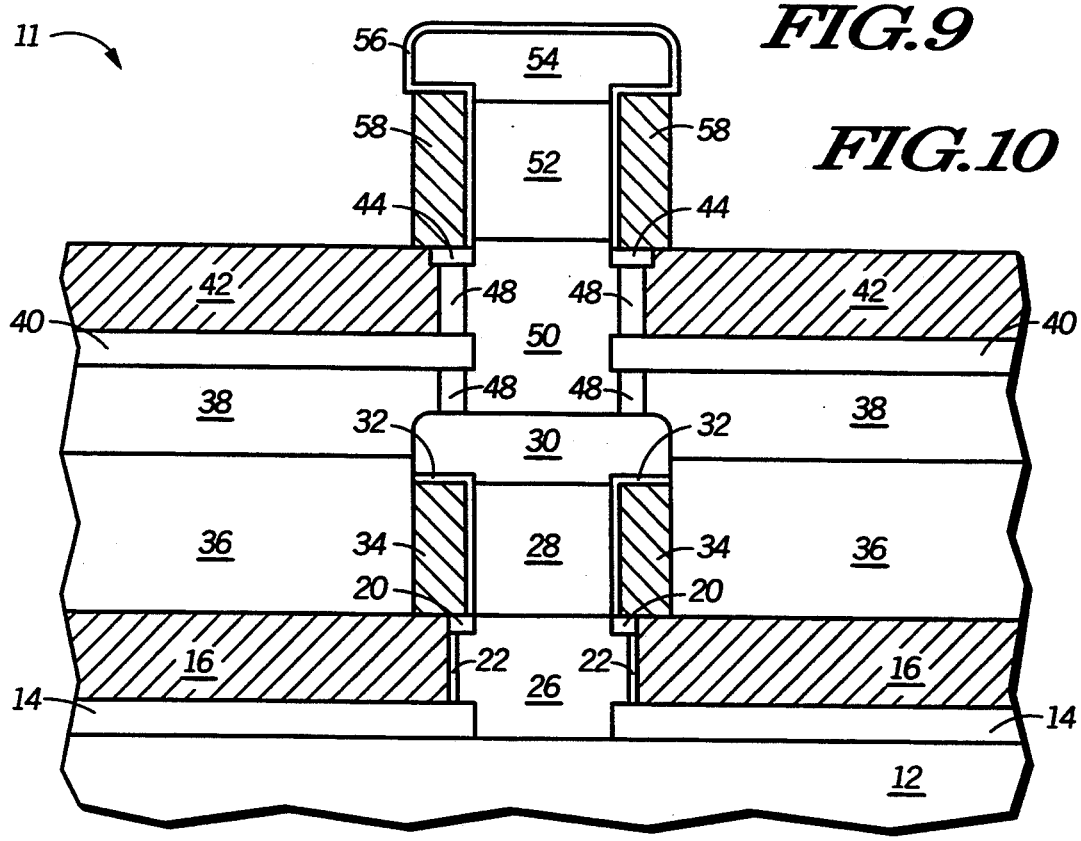

In FIG. 10, a gate oxide layer 56 and a control electrode 58 are formed as taught in FIG. 4. The masking layer 44 is removed as taught herein and an epitaxial or selective growth process is used to form an electrical interconnection between the conductive layer 40 and the control electrode 58.

Figure 11:
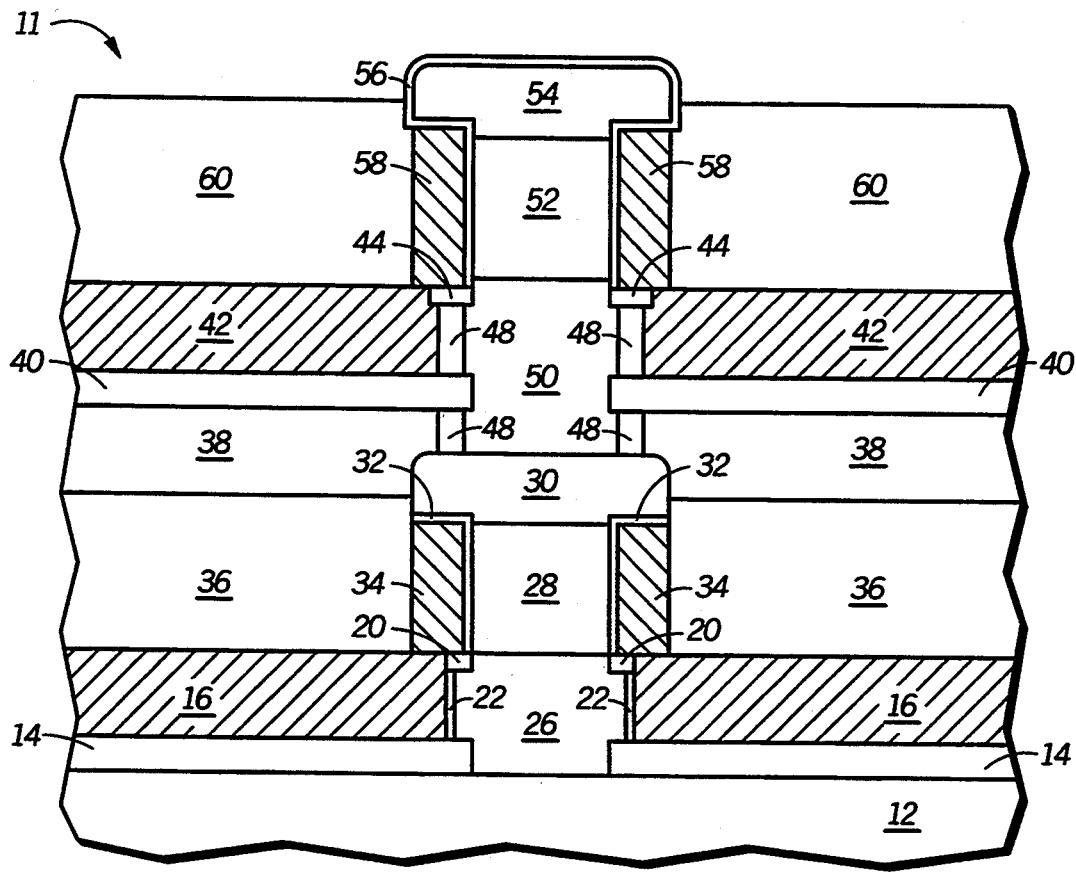

In FIG. 11, a dielectric layer 60 is used to passivate the transistor 11.

FIGS. 1–11 illustrate that vertical transistors may be vertically stacked. These vertically stacked structures may be used to form compact inverter circuits, switch networks, memory devices, flip flops, or the like.

Figure 12:
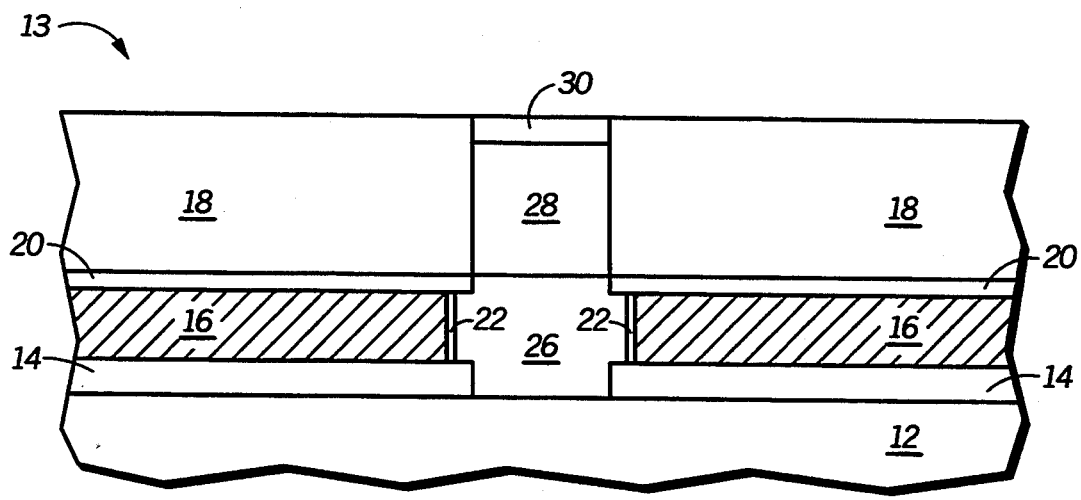
FIGS. 12–14 illustrate, in cross-sectional form, another method for forming a vertical transistor in accordance with the present invention.
Figure 13:
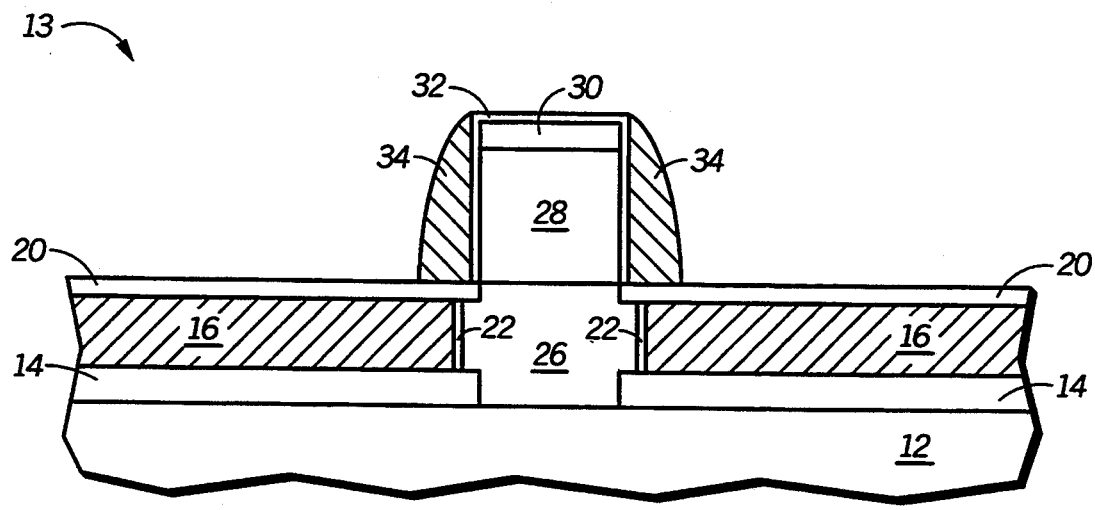
Figure 14:
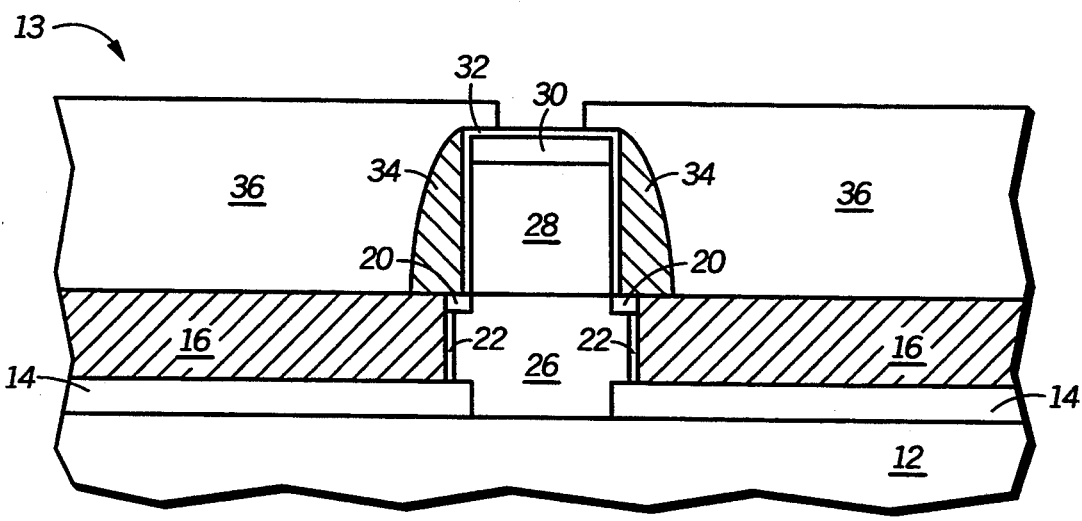

FIGS. 12–14 illustrate a method for forming a vertical transistor 13 in accordance with the present invention. FIG. 12 illustrates the substrate 12, dielectric layer 14, conductive layer 16, masking layer 20, dielectric layer 18, and sidewall dielectric layer 22 as illustrated in FIG. 2. In FIG. 12, an epitaxial or selective growth process is used to form the first current electrode 26 and the channel region 28 as illustrated. The second current electrode 30 is formed via epitaxial/selective growth, ion implantation, diffusion, and/or like formation techniques.

In FIG. 13, a dielectric layer 32 is formed overlying the channel region 28 and the second current electrode 30. A conformal layer of material (not illustrated), which is preferably polysilicon or a similar silicon-comprising material, is formed overlying the dielectric layer 32. The conformal layer of material (not illustrated) is etched using spacer etch technology to form a conductive spacer 34 as a gate electrode.

In FIG. 14, the masking layer 20 is removed as taught herein and an epitaxial/selective growth step electrically contacts the conductive layer 16 to the conductive layer 34. A dielectric layer 36 is formed to protect and insulate the transistor 13.

Transistor 13 is similar to the transistor 10 in that the gate formation and the gate interconnection does not require lithography. In addition, electrical short circuits between the gate connection and the second current electrode connection of transistors 10, 11, and 13 are reduced when compared to other known vertical transistors.

While the present invention has been illustrated and described with reference to specific embodiments, further modifications and improvements will occur to those skilled in the art. For example, any conductive or semiconductive material may be selectively or epitaxially grown to form the vertical transistor taught herein. Epitaxial/selective growth methods vary in temperature, doping mechanisms, length of growth time, procedures, and chemistry, and most of these epitaxial/selective processes are capable of forming the source and drain electrodes and channel regions of the inventive transistor. Many circuit applications exist for the inventive transistor. Many cleaning cycles exist for implementing the described epitaxial/selective growth procedures.

Sidewall dielectrics may be formed in one of several ways and may be used as sidewall gate dielectrics or as isolation oxides. Both N-channel and P-channel devices can be manufactured with the inventive process. The inventive transistor taught herein is compatible with several known bipolar transistors. Therefore, bipolar complementary metal oxide semiconductor (BiCMOS) devices may be manufactured. A deposited conductive layer may be used to form the control electrode interconnection. It is to be understood, therefore, that this invention is not limited to the particular forms illustrated and that it is intended in the appended claims to cover all modifications that do not depart from the spirit and scope of this invention.

We claim:

1. A transistor comprising:
   a substrate formed of a semiconductor material;
   a dielectric layer formed overlying the substrate and having a first portion of an opening which exposes a portion of the substrate to form an exposed substrate portion;
   a conductive interconnect layer formed overlying the dielectric layer, the conductive layer having a second portion of an opening horizontally aligned with the first portion of the opening;
   a vertically raised region made of the semiconductor material and overlying the exposed substrate portion and lying within the first portion and second portion of the opening, the vertically raised region having a first electrode, a second electrode overlying the first electrode, and a channel region separating the first electrode and the second electrode;
   a gate electrode dielectric layer formed adjacent the channel region and overlying the conductive interconnect layer;
   a gate electrode formed overlying the conductive interconnect layer and being laterally adjacent the gate electrode dielectric layer for selectively altering a current flow through the channel region in response to a voltage applied to the gate electrode; and
   a contact region wherein a bottom portion of the gate electrode contacts a top portion of the conductive interconnect layer.

2. The transistor of claim 1 wherein one of either the gate electrode or the conductive interconnect layer is made of a material which will selectively grow in a selected environment.

3. The transistor of claim 1 wherein a doped diffusion region is formed within the substrate and coupled to the first electrode.

4. The transistor of claim 1 wherein the gate electrode is formed as a sidewall spacer structure.

5. The transistor of claim 1 wherein the first electrode is an electrode formed having a lightly doped drain sub-region and a heavily doped drain sub-region.

6. The transistor of claim 1 wherein the second electrode is an electrode formed having a lightly doped drain sub-region and a heavily doped drain sub-region.

7. The transistor of claim 1 wherein a lateral overgrowth region of the second electrode is used to define a geometric width of the gate electrode.

* * * * *